United States Patent
Donkers et al.

(10) Patent No.: US 7,906,403 B2
(45) Date of Patent: Mar. 15, 2011

(54) BIPOLAR TRANSISTOR AND METHOD OF FABRICATING THE SAME

(75) Inventors: Johannes JTM Donkers, Valkenswaard (NL); Wibo D. Van Noort, Wappingers Falls, NY (US); Philippe Meunier-Beillard, Kortenberg (BE); Sebastien Nuttinck, Heverlee (BE); Erwin Hujzen, Blanden (BE); Francois Neuilly, Colomby-Sur-Thaon (FR)

(73) Assignee: NXP B.V., Eindhoven (NL)

( * ) Notice: Subject to any disclaimer, the term of this patent is extended or adjusted under 35 U.S.C. 154(b) by 198 days.

(21) Appl. No.: 11/814,281

(22) PCT Filed: Jan. 12, 2006

(86) PCT No.: PCT/IB2006/050107
§ 371 (c)(1),
(2), (4) Date: Jun. 12, 2009

(87) PCT Pub. No.: WO2006/077502
PCT Pub. Date: Jul. 27, 2006

(65) Prior Publication Data
US 2010/0025808 A1    Feb. 4, 2010

(30) Foreign Application Priority Data

Jan. 18, 2005  (EP) .................................... 05100274
May 12, 2005  (EP) .................................... 05103967

(51) Int. Cl.
*H01L 21/331*  (2006.01)
*H01L 21/8222*  (2006.01)

(52) U.S. Cl. .......................... 438/311; 438/359; 257/526

(58) Field of Classification Search .................. 438/311, 438/359, 361, 597; 257/526, E21.372, E29.182
See application file for complete search history.

(56) References Cited

U.S. PATENT DOCUMENTS

| 4,333,227 A | 6/1982 | Horng et al. |
| 4,982,257 A | 1/1991 | Akbar et al. |

(Continued)

FOREIGN PATENT DOCUMENTS

| EP | 0566112 A2 | 10/1993 |
| WO | WO03100845 A1 | 12/2003 |

OTHER PUBLICATIONS

C. C. G. Visser et al "Expitaxially Grown N+ Phosphorus Collector Peaks in High-Frequency HBT'S With Implanted Emmiters" Materials Research Society 1998, vol. 533 pp. 105-110 http://www.mrs.org/meetings/spring98/asbook/AbstractBookFF.html.

*Primary Examiner* — Phuc T Dang

(57) ABSTRACT

Consistent with an example embodiment, there is a bipolar transistor with a reduced collector series resistance integrated in a trench of a standard CMOS shallow trench isolation region. The bipolar transistor includes a collector region manufactured in one fabrication step, therefore having a shorter conductive path with a reduced collector series resistance, improving the high frequency performance of the bipolar transistor. The bipolar transistor further includes a base region with a first part on a selected portion of the collector region (6, 34), which is on the bottom of the trench, and an emitter region on a selected portion of the first part of the base region. A base contact electrically contacts the base region on a second part of the base region, which is on an insulating region. The collector region is electrically contacted on top of a protrusion with a collector contact.

11 Claims, 6 Drawing Sheets

U.S. PATENT DOCUMENTS

Figure 1:
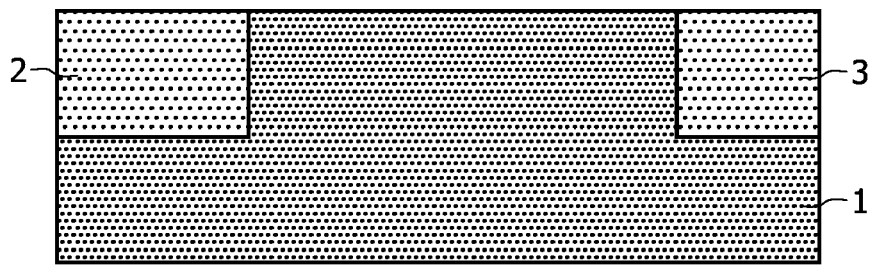

| | | | |
|---|---|---|---|
| 5,234,846 A * | 8/1993 | Chu et al. | 438/311 |
| 6,548,364 B2 | 4/2003 | Hsu | |
| 6,674,144 B1 | 1/2004 | Essaian | |
| 7,038,249 B2 * | 5/2006 | Suligoj et al. | 257/183 |
| 7,342,293 B2 * | 3/2008 | Wallner et al. | 257/565 |
| 7,521,328 B2 * | 4/2009 | Song | 438/311 |
| 2004/0104448 A1 | 6/2004 | Marty et al. | |

* cited by examiner

BIPOLAR TRANSISTOR AND METHOD OF FABRICATING THE SAME

This application is a §371 application of PCT/IB2006/050107 filed on Jan. 12, 2006, which in turns claims priority from European applications, EP05100274.9, filed on Jan. 18, 2005 and EP05103967.5 filed on May 12, 2005.

The invention relates to a bipolar transistor and a method of fabricating the same.

In WO 03/100845 a method for fabricating a bipolar transistor is disclosed, in which a substrate is provided with two regions of shallow trench isolation and an insulating layer covering the substrate. Further, three different collector layers are provided that form an electrically conductive path of the collector to the surface of the substrate, comprising an N-type collector epitaxial layer between the two regions of shallow trench isolation, a buried collector n-layer and an n-plug sinker. A layer structure including a conductive layer is formed on the insulating layer, after which a transistor opening area is etched through the conductive layer. Thereafter a SiGe base layer is deposited on the inner wall of the transistor area opening, thereby electrically connecting the SiGe base layer with the conductive layer and the N-type collector epitaxial layer.

It has been found that the collector of the thus manufactured bipolar transistor exhibits a relatively large parasitic series resistance thereby reducing the performance of the bipolar transistor, such as the frequency response. Another disadvantage is the need for a stack of layers to create a transistor opening area in which the bipolar transistor is formed, which increases the number of fabrication steps and hence the fabrication costs.

It is an object of the invention to provide a method for fabricating a bipolar transistor with a reduced collector series resistance. According to the invention, this object is achieved by providing a method for fabricating a bipolar transistor as claimed in claim 1.

This fabrication method provides a collector region, which is unitary because it is composed of only one semiconductor material and manufactured in one fabrication step. The unitary collector region achieves a shorter electrically conductive path of the collector region, resulting in a reduced collector series resistance, which has a positive impact on the high frequency performance of the bipolar transistor. Another advantage is that the collector region is formed with a reduced number of fabrication steps. Another advantage of the invention is that the standard CMOS shallow trench isolation is used to form the transistor opening area for the bipolar transistor, thereby reducing the number of fabrication steps.

In a first embodiment of the invention, an electrical connection to the collector region may be formed on a selected portion of the collector region on a top surface of a protrusion, which is advantageous because a direct electrical connection to the unitary collector region is established without the need for an additional fabrication step, such as an implant.

In an embodiment, a base region of a third semiconductor material is formed having a first part which covers a selected portion of the exposed collector region on the bottom of the trench, a second part which at least extends over a portion of the insulation region and a third part which covers the first sidewall of the trench. The advantage of this fabrication method is that the base region is a unitary region wherein a base to collector junction is fabricated above the bottom of the trench while simultaneously providing an electrically conductive connection to the base region on a selected portion of the second part of the base region, whereas in the prior art more than one layer and more than one fabrication step is needed to fabricate the base region. Another advantage is that the base to collector capacitance is limited to the first part of the base region only.

In another embodiment the collector region may be created with an epitaxial growth, which forms a semiconductor region on the exposed semiconductor regions only. An advantage of this method is that it forms the collector region fully self-aligned. Another advantage is that this method adds a degree of freedom to optimize the collector profile by adding one or more dopants during the epitaxial growth of the collector region.

In an embodiment a fabrication method is disclosed in which the semiconductor material of the collector region is partly replaced by a metal layer thereby advantageously reducing the collector resistance.

The bipolar transistor fabricated according to the invention, has a unitary collector region, which simultaneously provides the collector needed for the bipolar transistor and an electrically conductive connection to a collector contact, a base region, which simultaneously provides the base needed for the bipolar transistor and an electrically conductive connection to a base contact, and an emitter region which simultaneously provides the emitter needed for the bipolar transistor and an electrically conductive connection to an emitter contact. The unitary collector region improves the high frequency performance of the bipolar transistor with respect to the implanted collector regions of the prior art, because of the reduced collector series resistance.

Figure 14:
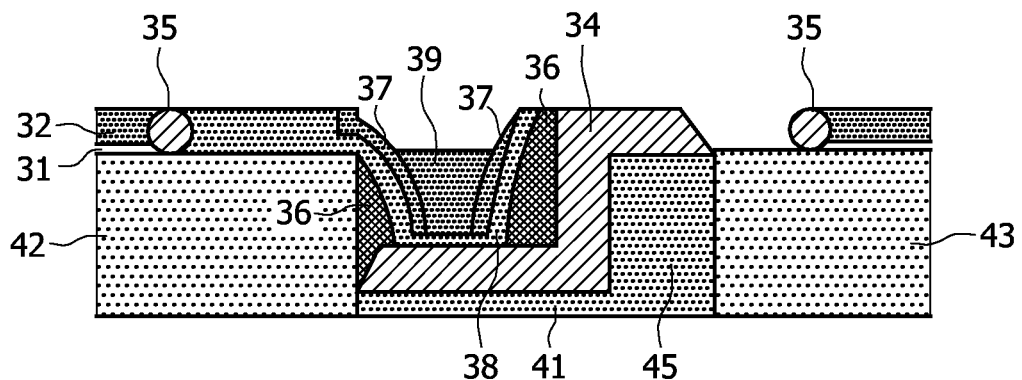
Figure 15:
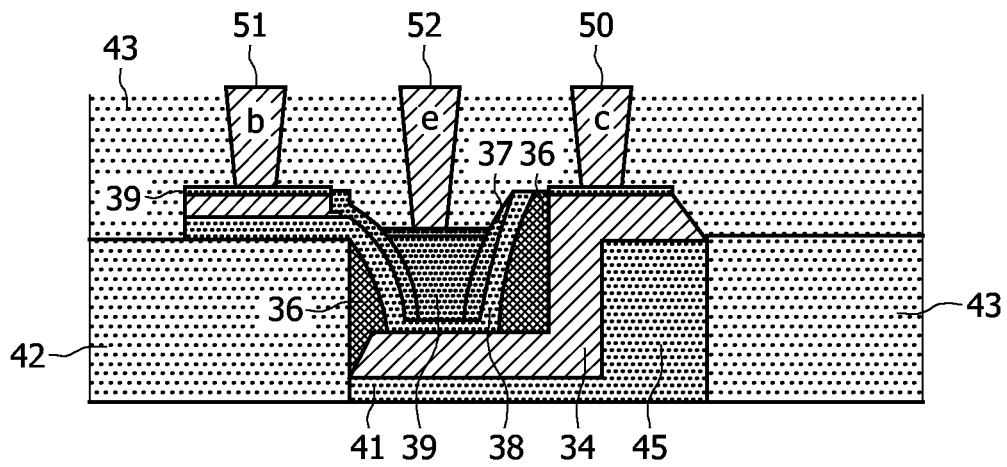
Figure 16:
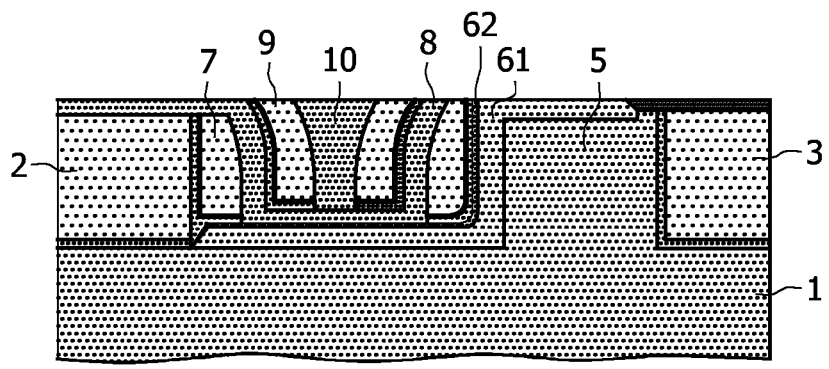
Figure 17:
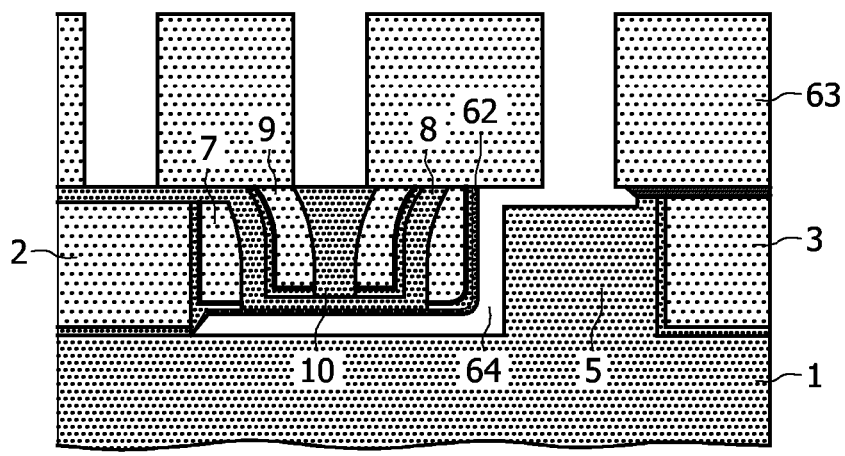
Figure 18:
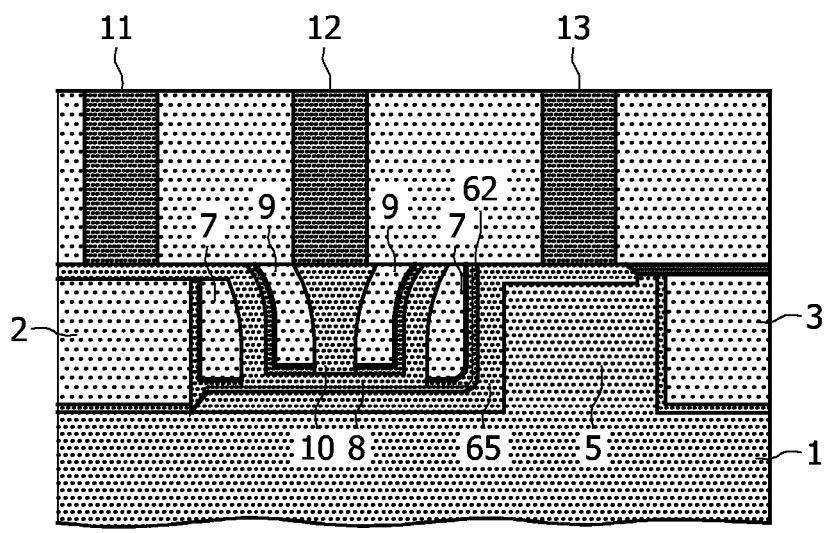

These and other aspects of the invention will be further elucidated and described with reference to the drawings, in which:

FIGS. 1-5 illustrate various stages of the fabrication of a bipolar transistor according to an embodiment of the invention and FIGS. 6-9 illustrate various stages of the fabrication of a bipolar transistor according to another embodiment of the invention and FIGS. 10-15 illustrate various stages of the fabrication of a bipolar transistor according to yet another embodiment of the invention and FIGS. 16-18 illustrate various stages of the fabrication of a bipolar transistor according to yet another embodiment of the invention.

The Figures are not drawn to scale. In general, identical components are denoted by the same reference numerals in the Figures.

FIG. 1 illustrates an initial structure comprising a silicon substrate 1 provided with two shallow trench isolation regions 2 and 3 that are fabricated using standard CMOS fabrication techniques. The shallow trench isolation regions 2 and 3 may comprise silicon dioxide or any other insulating material.

Figure 2:
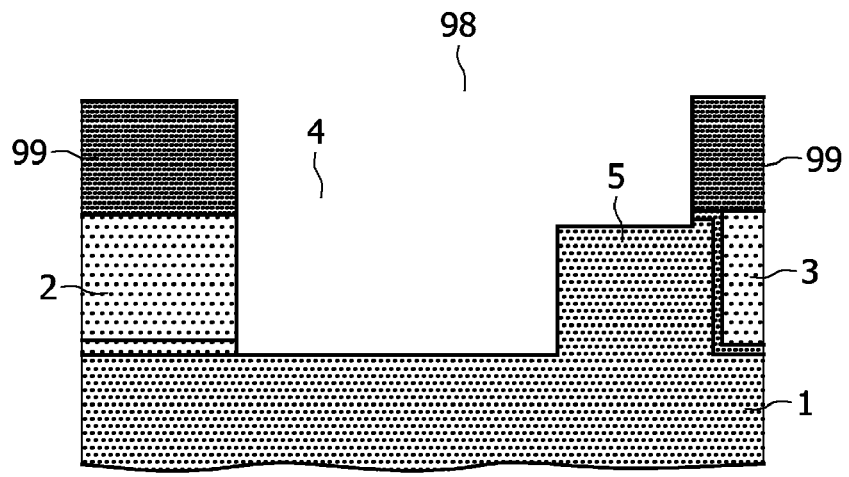

Thereafter, as is illustrated in FIG. 2, a resist layer 99 is formed and photolithographic techniques are applied to form a transistor opening area 98, exposing a portion of the shallow trench isolation region 2 and a portion of the silicon substrate 1. The exposed portion of the shallow trench isolation region 2 is etched selectively with respect to the silicon substrate 1. Now a trench 4 and a protrusion 5 are formed, the protrusion 5 comprising the silicon substrate 1. The trench 4 has a first sidewall adjoining the shallow trench isolation region 2, a second sidewall adjoining the protrusion 5 and a bottom that exposes the silicon substrate 1.

Figure 3:
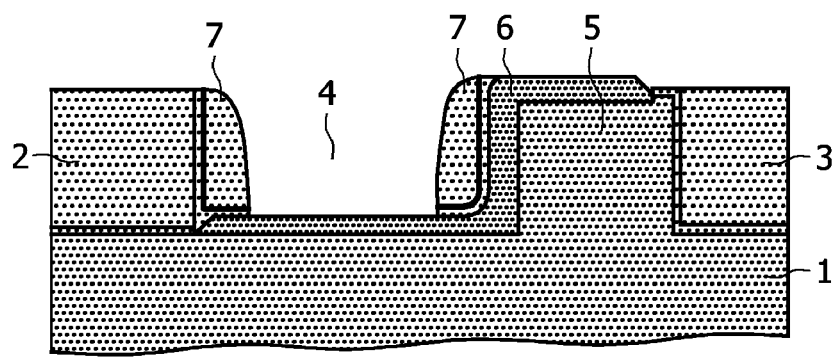

After the removal of the resist layer 99, an epitaxial growth forms a silicon layer on the exposed silicon regions only, thereby forming a collector region 6, as is illustrated in FIG. 3. This fabrication step forms the collector region 6 in a self-aligned way on the bottom of the trench 4, on the second sidewall of the trench 4 and on the top surface of the protrusion 5, whereas the surfaces of the isolation regions 2 and 3 are not covered with silicon. Subsequently insulating spacers 7 are formed using conventional deposition and etching techniques. In this case the spacers 7 are composed of L-shaped silicon nitride spacers and D-shaped silicon dioxide spacers, but any other insulating material or shape may be applied to form the spacers 7.

Figure 4:
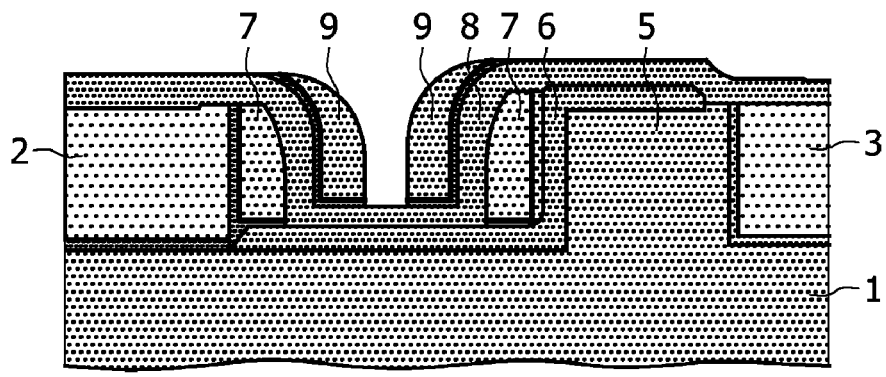

After the forming of the spacers 7, a base region 8 is formed with epitaxial growth, as is illustrated in FIG. 4. The base region 8 comprises a first part which covers a selected portion of the exposed collector region 6 on the bottom of the trench 4, a second part which at least extends over a portion of the insulation region 2 and a third part which covers the first sidewall of the trench 4. The base region 8 may comprise silicon or silicon germanium or another suitable semiconductor material. The spacers 7 define an intrinsic collector region, which comprises a portion of the collector region 6 on the bottom of the trench 4, which portion is covered by the base region 8, thereby forming a base-collector junction. In the next steps two spacers 9 are formed using conventional deposition and etching techniques. Also in this case the spacers 9 are composed of L-shaped silicon nitride spacers and D-shaped silicon dioxide spacers, but any other insulating material or shape may be applied to form the spacers 9.

Figure 5:
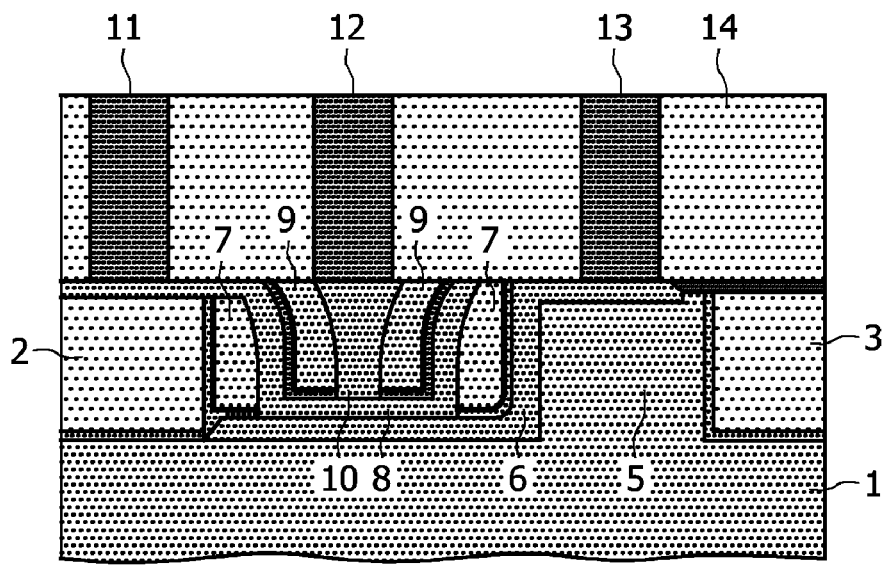

Thereafter, as is illustrated in FIG. 5, an emitter region 10 is formed by depositing a polysilicon layer, or a mono silicon layer. The spacers 9 define an intrinsic base region, which comprises a portion of the first part of the base region 8, which is covered by the emitter region 10. Chemical mechanical polishing (CMP) is applied to separate the base region 8 from the emitter region 10, to expose a portion of the second part of the base region 8, to expose a portion of the collector region 6 on the protrusion 5 and to planarize the surface of the device. The CMP fabrication step may be stopped after a defined amount of time, but also a layer may be added which serves as a stopping layer. In this way, the CMP fabrication step simultaneously forms an electrical connection to a portion of the second part of the base region 8 and an electrical connection to the collector region 6 on the protrusion 5. Next, a collector contact 13, a base contact 11 and an emitter contact 12 are fabricated using standard CMOS fabrication techniques. The collector contact 13 is formed on the portion of the collector region 6 on the protrusion 5 that was exposed using the CMP fabrication step, and the base contact 11 is formed on the portion of the second part of the base region 8 that was exposed using the same CMP fabrication step.

For fabricating the bipolar transistor, as illustrated in FIGS. 1-5, only one masking step was used. The collector region 6, the base region 8, and the emitter region 10 are all formed self-aligned to this mask. The collector region 6 and the base region 8 both comprise an intrinsic and an extrinsic portion, the intrinsic portion being the portions where the bipolar transistor action takes place, which are the collector-base and the base-emitter junctions, the extrinsic portions forming electrically conductive connections to the respective intrinsic portions. The extrinsic portions introduce unwanted parasitic devices that reduce the performance of the intrinsic bipolar transistor. In this embodiment the extrinsic base and collector portions are formed self-aligned and in the same base, respectively collector layer that form the intrinsic base and collector portions respectively. The collector region 6 has a relatively short extrinsic portion and therefore a relatively short parasitic resistive path. Hence a reduced collector resistance and an improved frequency performance of the bipolar transistor is achieved with respect to the prior art in which three different implanted collector regions define the resistive path of the collector.

FIGS. 6-9 illustrate fabrication steps according to another embodiment of the invention, wherein photolithographic techniques are used to define the collector, base and emitter regions.

Figure 6:
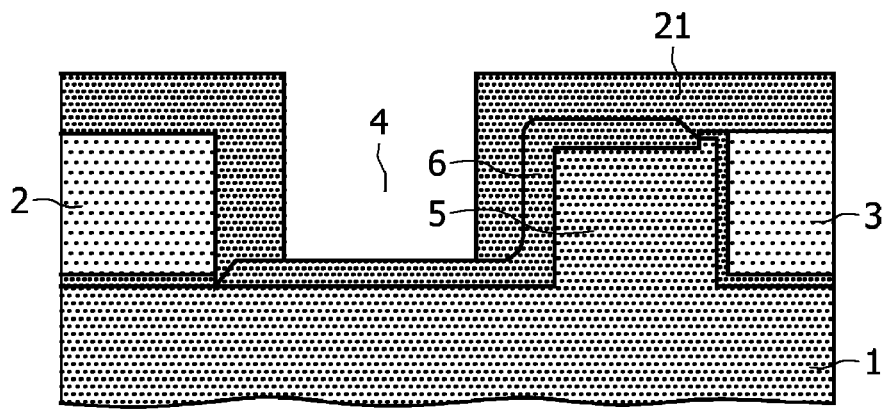

FIG. 6 illustrates the situation wherein the collector region 6 is formed, which is fabricated in the same fashion as the previous embodiment. After forming the collector region 6, a silicon dioxide layer 21 is deposited, and, using photolithographic techniques, a window is etched in the silicon dioxide layer 21 to expose a portion of the collector region 6 that covers the bottom of the trench 4, thereby defining an intrinsic portion of the collector region 6.

Figure 7:
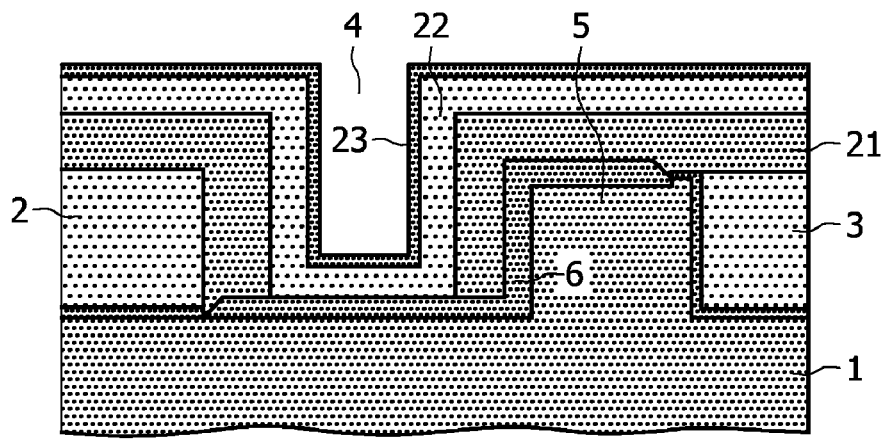

Next, as illustrated in FIG. 7, a base region 22 is formed with epitaxial growth, which may comprise silicon or silicon germanium or another suitable semiconductor material. The base region 22 comprises a first part which covers the intrinsic portion of the collector region 6 on the bottom of the trench 4, a second part which at least extends over a portion of the insulation region 2 and a third part which at least extends over a portion of the protrusion 5. Thereafter a dielectric layer 23 is deposited on the base region 22. The dielectric layer 23 may comprise silicon dioxide, silicon nitride or any other insulating material or a combination thereof.

Figure 8:
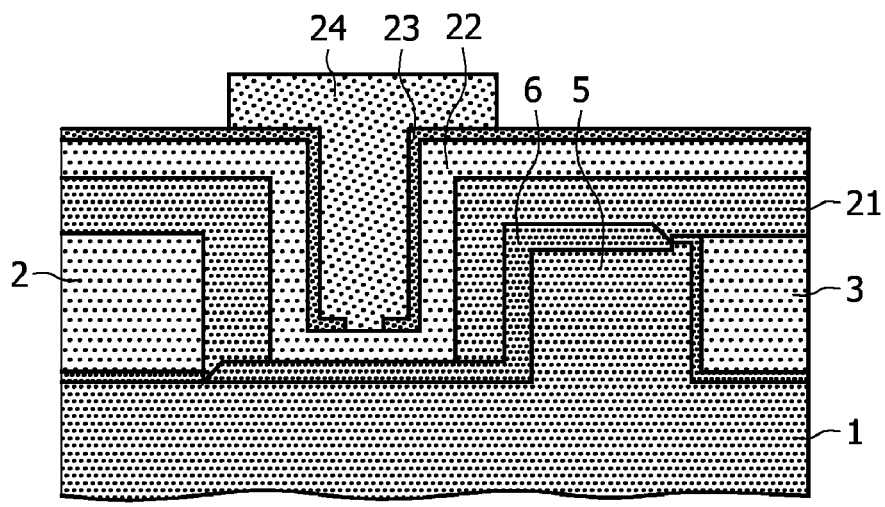

Subsequently, as is illustrated in FIG. 8, using photolithographic techniques, a window is etched in the dielectric layer 23 to expose a portion of the first part of the base region 22, thereby defining an intrinsic portion of the base region 22. Next an emitter region 24 is formed by deposition and subsequent patterning of a polysilicon layer, thereby forming a base-emitter junction.

Figure 9:
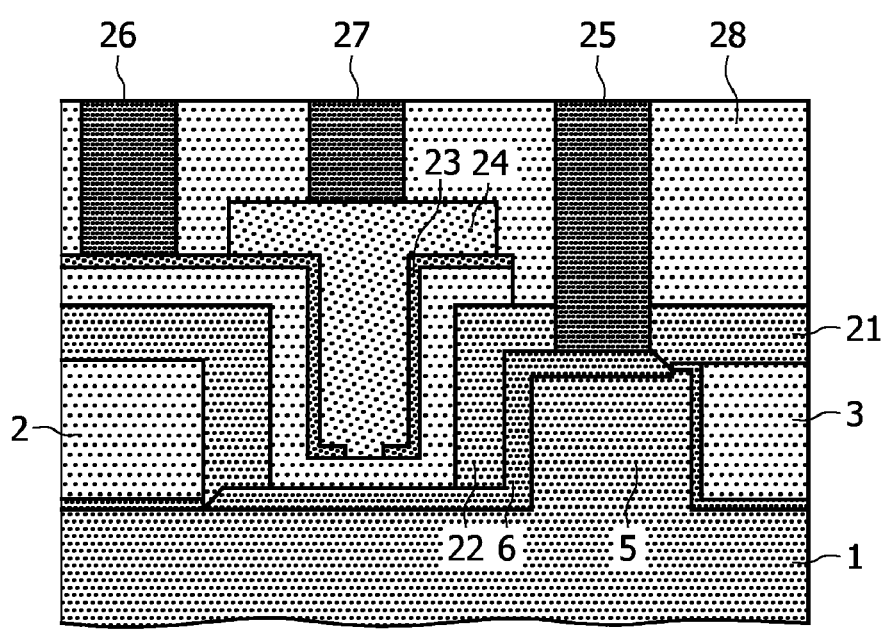

Thereafter a portion of the third part of the base region 22 is removed by using photolithography and etching, as is illustrated in FIG. 9. In this way a portion of the collector region 6 on the top surface of the protrusion 5 is exposed for making a collector contact by etching through the silicon dioxide layer 21. Next, a collector contact 25, a base contact 26 and an emitter contact 27 are fabricated using standard CMOS fabrication techniques. The collector contact 25 is formed on the exposed portion of the collector region 6 on the protrusion 5, and the base contact 26 is formed on a portion of the second part of the base region 22.

In this embodiment the intrinsic base and collector portions are formed with photolithographic techniques, whereas the previous embodiment the intrinsic base and collector portions are formed in a self-aligned way. In both embodiments the intrinsic base and collector portions and the extrinsic base and collector portions are formed in the same base, respectively collector layer.

FIGS. 10-15 illustrate fabrication steps according to another embodiment of the invention, wherein a CMOS polysilicon gate is used to fabricate the bipolar transistor.

Figure 10:
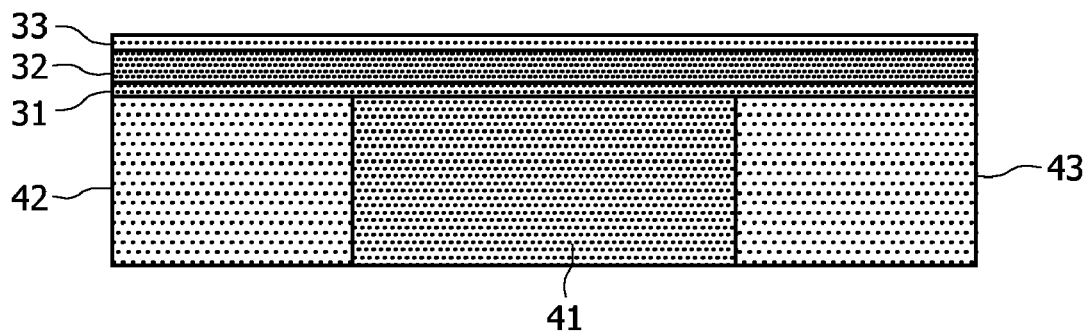

In this embodiment, as is illustrated in FIG. 10, a silicon substrate 41 is provided with two shallow trench isolation regions 42 and 43, a stack comprising a gate oxide layer 31, a polysilicon layer 32, which serves as the gate electrode in the CMOS part, and a hard mask 33, which comprises silicon dioxide, silicon nitride or a combination thereof.

Figure 11:
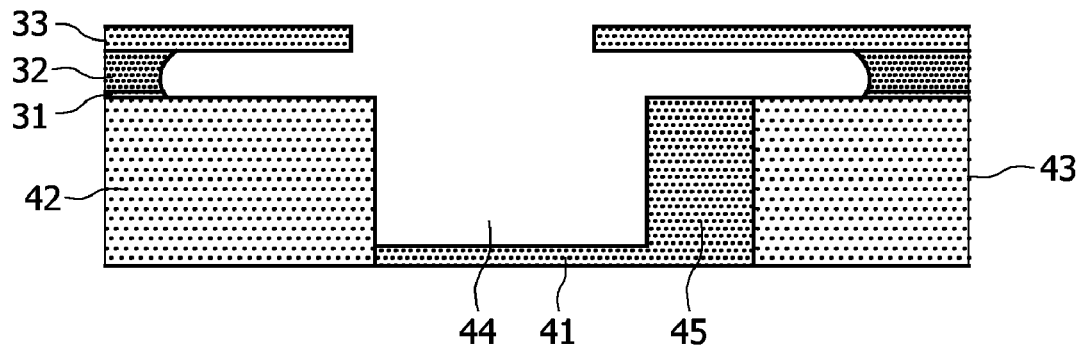

As is illustrated in FIG. 11, a window is formed in the hard mask thereby defining the region where the bipolar transistor is fabricated. Thereafter the polysilicon layer 32 is etched isotropically, thereby removing the polysilicon layer 32 that covers the top surface of the substrate and a portion of the top surface of the shallow trench isolation regions 42 and 43 and exposing sidewalls of the polysilicon layer 32. Next, the exposed gate oxide layer 31 is removed with a wet etch comprising for example a HF-based etch solution, thereby exposing the silicon substrate 1 and the shallow trench isolation regions 2 and 3. Subsequently a trench 44 and a protrusion 45 are formed by etching the silicon substrate 41 with a combination of an anisotropic and an isotropic etching step to obtain under etching of the silicon substrate 41 beneath the hard mask 33. The trench 44 has a first sidewall adjoining the shallow trench isolation region 42, and a second sidewall adjoining the protrusion 45 and a bottom that exposes the substrate 41.

Figure 12:
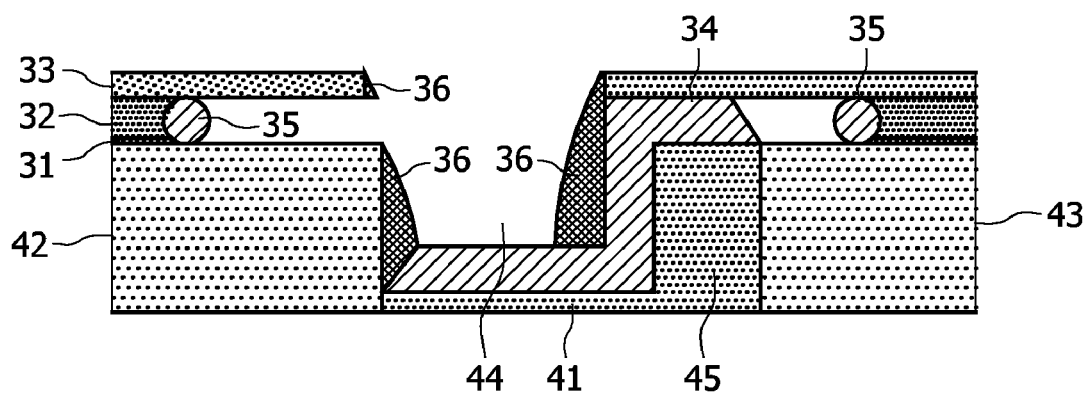

Next, as is illustrated in FIG. 12, an epitaxial growth forms a silicon layer on the exposed silicon substrate 41 and polysilicon layer 32 only, thereby forming a collector region 34 and two silicon regions 35. This fabrication step forms the collector region 34 in a self-aligned way on the bottom of the trench 44, on the second sidewall of the trench 44 and on the top surface of the protrusion 45. The silicon regions 35 cover the exposed sidewalls of the polysilicon layer 32 completely, thereby filling the space between the hard mask 33 and the shallow trench isolation regions 42 and 43. Subsequently insulating spacers 36 are formed using conventional deposition and etching techniques. The spacers 36 cover the first sidewall of the trench 44 and a portion of the collector region 34 that covers the second sidewall of the trench 44. The space between the hard mask 33 and the shallow trench isolation region 42 is not filled with the dielectric material of the spacers 36, which may be obtained by forming the spacers 36 with a deposition of a dielectric material which has a poor step coverage, or by forming the spacers 36 with a thermally grown silicon dioxide.

Figure 13:
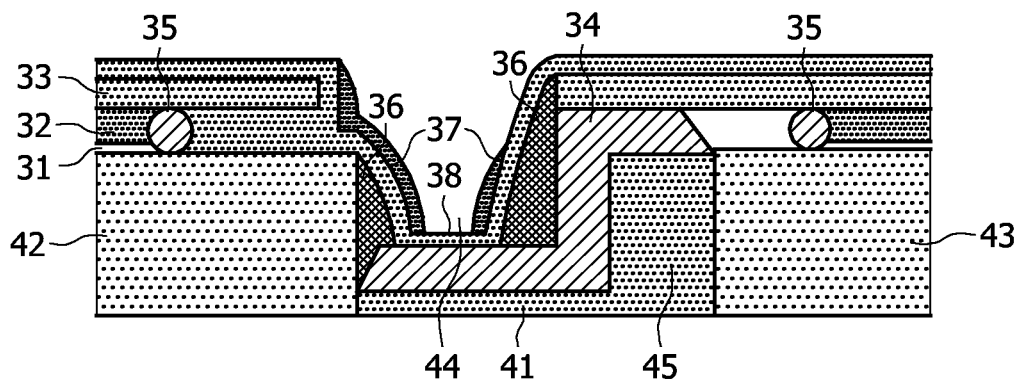

Thereafter, as is illustrated in FIG. 13, a base region 38 is formed with epitaxial growth, thereby filling the space between the hard mask 33 and the shallow trench isolation region 42, covering the spacers 36, covering the exposed collector region 34 that is on the bottom of the trench 44 and covering the exposed regions of the hard mask 33. The base region 38 may comprise silicon or silicon germanium or another suitable semiconductor material. The spacers 36 define an intrinsic collector region, which comprises a portion of the collector region 34 on the bottom of the trench 34, which portion is covered by the base region 38, thereby forming a base-collector junction. Subsequently, two spacers 37 are formed using conventional deposition and etching techniques. The spacers 37 may comprise silicon dioxide or any other dielectric material that may be used for spacer formation.

Thereafter, as is illustrated in FIG. 14, an emitter region 39 is formed on the exposed top surfaces by deposition of a polysilicon layer, followed by the removal of the emitter region 39 and the base region 38 that are covering the hard mask 33, using a CMP fabrication step that stops on the hard mask 33. Thereafter, the hard mask 33 is removed using standard etching techniques. The spacers 37 define an intrinsic base region, which comprises a portion of the base region 38 that extends on the bottom of the trench 44 where the emitter region 39 is in contact with the base region 38, thereby forming an emitter-base junction.

Next, as is illustrated in FIG. 15, the polysilicon regions 35 and the polysilicon layer 32 are removed by patterning and etching using a CMOS polysilicon gate mask. Thereafter a collector contact 50, a base contact 51 and an emitter contact 52 are fabricated using standard CMOS fabrication techniques. The collector contact 50 is formed on a portion of the collector region 34, which is on the protrusion 45, and the base contact 51 is formed on a portion of the base region 38, which is on the insulation region 42.

This embodiment advantageously uses the CMOS polysilicon gate layer 32 to fabricate a bipolar transistor with a unitary base and a unitary collector region. The intrinsic base and collector portions are formed in a similar self-aligned way as the embodiment described in FIGS. 1-5.

FIGS. 16-18 illustrate fabrication steps according to another embodiment of the invention, wherein a selective portion of the semiconductor material of the collector region is replaced by a metal layer.

The fabrication method is identical to the method which is illustrated in FIGS. 1-5, with the exception that the epitaxial silicon layer of the collector region 6 in this embodiment comprises a stack of a silicon germanium (SiGe) layer 61 and a silicon layer 62. Furthermore the CMP step, which is applied to separate the base region 8 from the emitter region 10, in this case exposes the SiGe layer 61, as is shown in FIG. 16, and hence the exposed portion of the silicon layer 62, which is on the protrusion 5, is removed by the CMP step.

Next, as is illustrated in FIG. 17, an insulation layer is deposited and patterned thereby forming a masking layer 63, which defines contact regions. Subsequently the SiGe layer 61 is removed selectively with respect to silicon which is comprised in the protrusion 5, the silicon layer 62 and the silicon substrate 1, thereby creating a space collector region 64.

Thereafter, as is illustrated in FIG. 18, the space collector region 64 is filled with tungsten thereby creating a tungsten collector region 65 which has a collector resistance that is reduced further compared to the collector region 6, which comprises silicon. Obviously it is also possible to fill the space collector region 64 with another metal. At this point the fabrication method continues with the method that is illustrated in FIG. 5 with the formation of the collector contact 13, the base contact 11 and the emitter contact 12.

In summary, the invention provides a bipolar transistor with a reduced collector series resistance integrated in a trench of a standard CMOS shallow trench isolation region. The bipolar transistor includes a collector region manufactured in one fabrication step, therefore having a shorter conductive path with a reduced collector series resistance, improving the high frequency performance of the bipolar transistor. The bipolar transistor further includes a base region with a first part on a selected portion of the collector region, which is on the bottom of the trench, and an emitter region on a selected portion of the first part of the base region. A base contact electrically contacts the base region on a second part of the base region, which is on an insulating region. The collector region is electrically contacted on top of a protrusion with a collector contact.

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. The word "comprising" does not exclude the presence of other elements or steps than those listed in a claim. The word "a" or "an" preceding an element does not exclude the presence of a plurality of such elements.

The invention claimed is:

1. A method for fabricating a bipolar transistor, the method comprising the steps of:
   providing a semiconductor substrate with an insulation region of a first insulating material adjoining a trench, said trench adjoining a protrusion of a first semiconductor material and comprising a first sidewall adjoining the insulation region, a bottom exposing the semiconductor substrate and a second sidewall adjoining the protrusion, and forming a collector region of the bipolar transistor of a second semiconductor material on the bottom and the second sidewall of the trench and on a top surface of the protrusion.

2. The method as claimed in claim 1, further comprising the step of forming an electrical connection to a selected portion of the collector region on the top surface of the protrusion.

3. The method as claimed in claim 1, further comprising the step of forming a base region of the bipolar transistor of a third semiconductor material having a first part which covers a selected portion of the exposed collector region on the bottom of the trench, a second part which at least extends over a portion of the insulation region and a third part which covers the first sidewall of the trench.

4. The method as claimed in claim 3, further comprising the step of forming an emitter region of the bipolar transistor of a fourth semiconductor material which covers a selected portion of the first part of the base region.

5. The method as claimed in claim 1, wherein the collector region is formed with an epitaxial growth.

6. The method as claimed in claim 3, wherein the base region is formed with an epitaxial growth.

7. The method as claimed in claim 3, further comprising the step of forming an electrical connection to a portion of the second part of the base region.

8. A bipolar transistor, comprising:
a semiconductor substrate with an insulation region of a first insulating material adjoining a trench, said trench adjoining a protrusion of a first semiconductor material and comprising a first sidewall adjoining the insulation region, a bottom exposing the semiconductor substrate and a second sidewall adjoining the protrusion, a collector region of an electrically conducting material extending on the bottom and the second sidewall of the trench and on the top surface of the protrusion, a base region of a third semiconductor material having a first part which covers a selected portion of the exposed collector region on the bottom of the trench, a second part which at least extends over a portion of the insulation region and a third part which covers the first sidewall of the trench, and an emitter region of a fourth semiconductor material contacting the base region on a selected portion of the first part of the base region.

9. A bipolar transistor as claimed in claim 8, further comprising:

a collector contact on the top surface of the protrusion electrically connected to the collector region, a base contact on the insulation region electrically connected to the base region, and an emitter contact electrically connected to the emitter region.

10. The method as claimed in claim 4, further comprising the steps of:

removing a selective portion of the second semiconductor layer thereby creating a space collector region, and filling the space collector region with a metal layer.

11. The method as claimed in claim 10, wherein the metal layer comprises tungsten.

* * * * *